United States Patent [19]
Van Brocklin et al.

[11] Patent Number: 6,011,371
[45] Date of Patent: Jan. 4, 2000

[54] PROPORTIONAL INTEGRAL FAN CONTROLLER FOR ELECTRONIC DEVICE

[75] Inventors: Andrew L. Van Brocklin, Corvallis; James F. Bausch, Salem, both of Oreg.

[73] Assignee: Hewlett-Packard Company, Palo Alto, Calif.

[21] Appl. No.: 09/295,661

[22] Filed: Apr. 21, 1999

Related U.S. Application Data

[63] Continuation of application No. 08/955,478, Oct. 22, 1997, Pat. No. 5,929,581.

[51] Int. Cl.[7] ........................................................ H02P 7/00
[52] U.S. Cl. ........................ 318/471; 318/268; 388/907.2; 388/934
[58] Field of Search ........................ 318/268, 272, 318/456, 461, 471; 388/934, 907.2; 307/651

[56] References Cited

U.S. PATENT DOCUMENTS

| | | | |
|---|---|---|---|
| 3,794,896 | 2/1974 | Holt | 318/471 |
| 4,168,456 | 9/1979 | Isobe | 318/471 |
| 4,276,506 | 6/1981 | Little | 318/306 |
| 4,297,851 | 11/1981 | Paddock et al. | 62/126 |
| 4,506,199 | 3/1985 | Asche | 318/313 |
| 5,099,181 | 3/1992 | Canon | 318/254 |
| 5,457,766 | 10/1995 | Ko | 388/831 |
| 5,460,009 | 10/1995 | Wills et al. | 62/180 |
| 5,825,972 | 10/1998 | Brown | 388/611 |

*Primary Examiner*—Bentsu Ro
*Attorney, Agent, or Firm*—Timothy F. Myers; Curtis G. Rose

[57] ABSTRACT

A controller drives a fan's motor to proportionally control fan speed based on changes in heat output from electrical components in a local environment. The controller is connected to a temperature sensor and the fan motor. The temperature sensor senses local environment temperature, while exhibiting a lag time. The controller provides closed loop control and implements a system pole which cancels out the temperature sensor lag time during steady state operations. The controller implements an integration of a difference between sensed temperature and a reference temperature to generate the system pole.

18 Claims, 2 Drawing Sheets

PROPORTIONAL INTEGRAL FAN CONTROLLER FOR ELECTRONIC DEVICE

CROSS REFERENCES TO CO-PENDING APPLICATION

This application is a continuation of U.S. patent application Ser. No. 08/955,478, filed on Oct. 22, 1997, now U.S. Pat. No. 5,929,581, assigned to the assignee of the present application.

BACKGROUND OF THE INVENTION

This invention relates generally to temperature control for computers, and more particularly to a method and apparatus for controlling a computer fan to cool a microprocessor and other resident computer components.

Integrated circuits and other electrical devices typically have rated operating temperature ranges. Within these ranges the devices behave according to specified requirements. Outside of such range the response characteristics of the circuits and devices can vary from the specified requirements. At excess temperatures, it is known for integrated circuits and other electrical devices to fail or burn out or otherwise become defective. Accordingly, it is desirable to maintain circuits and devices within operating temperature ranges.

In a computer system, continued operation of a device leads to the generation of heat. In some instances the ambient air is sufficient to provide cooling to maintain the circuit or device within the desired operating temperature range. Some circuits or components generate enough heat to require affirmative cooling from a fan. Typically, computers have included a cooling fan inside the computer case to prevent overheating caused by the normal operation of the computer.

As microprocessors have increased in speed, the amount of heat generated by the microprocessor also has increased. It is known to include a heat sink immediately adjacent to the microprocessor to absorb some of such heat. A challenge in designing computers with such microprocessors is that the heat generated by the microprocessor can adversely affect nearby components. For example, these high speed microprocessors often have larger operating temperature ranges and increased heat sink capabilities, while other components continue to be manufactured under prior requirement levels. Thus, although the microprocessor may handle an increased temperature, such increased temperature may adversely impact a nearby circuit or device. The impact is significant for notebook computers where components are often spaced more closely. The impact is heightened as such computers are being kept on for longer durations because many notebook computers are now used as primary computers. Accordingly, cooling techniques are important to the design and operation of notebook computers and other computer systems.

Many cooling techniques for a computer involve the operation and control of a cooling fan. One conventional scheme for controlling a computer's cooling fan is based on thermostat control. A temperature sensor detects the temperature at a prescribed location within a computer system. When such temperature exceeds a prescribed temperature, the cooling fan turns on. When the temperature falls below such temperature, the fan turns off. Typically once the fan turns on, there is a minimum time before the fan turns off. Such time prevents the fan from oscillating between on and off states. In such scheme there is just one speed for the fan. The turning on and off of the fan at full speed is noticeably noisy and irritating to the user.

Another conventional scheme for controlling a cooling fan for a computer is based on open-loop, series thermistor control. A thermistor is connected in series to the cooling fan. The specifications of the thermistor determine the temperature set point at which the fan turns on. As the temperature exceeds the set point the thermistor causes the power passed to the fan to increase. As a result the fan increases in speed. There are shortcomings of the series thermistor, however, as a basis for cooling computer components. First, there is a time lag between when the temperature reaches the set point temperature and when the thermistor changes its resistance to cause the fan to turn on or change speeds. As a result the set point temperature often has to be selected to be less than a desired set point so that the fan comes on before temperatures exceed maximum temperature specifications for nearby components (e.g., microprocessor, memory) or peripherals (e.g., hard drive, CD-ROM drive, battery, display controller). Another shortcoming is that the series thermistor is a large component which is too big to locate near a microprocessor—particularly for notebook computer implementations.

SUMMARY OF THE INVENTION

According to the invention, a controller drives a fan's motor to proportionally control fan speed based on changes in heat output from electrical components in a local environment. The controller is connected to a temperature sensor and the fan motor. The temperature sensor senses local environment temperature near, for example, a processor. Typically, the temperature sensor exhibits a lag time. The controller provides closed loop control and implements a system pole which cancels out the temperature sensor lag time during steady state operations. Specifically, the controller implements an integration of a difference between sensed temperature and a reference temperature. Once the fan has been on and cools the local environment temperature, the controller eventually reaches a steady state condition where the heat generated by local components is being offset by the cooling effect of the fan. As such heat varies, the cooling to maintain a prescribed reference temperature varies. The controller varies the fan speed during such time to maintain steady state conditions. During such time, the rate of change of the fan speed varies in proportion to the change in heat. The integration for determining such rate of change introduces a pole in system response to cancel out the lag time of the temperature sensor. Accordingly, effective temperature control is maintained for driving the fan at a speed related to the changes in detected temperature.

According to an aspect of this invention, a reference or set point temperature is prescribed. The local environment temperature is to be maintained at or below this set point temperature. In an electronic device having the fan, fan controller and a processor and other components to be cooled, the local environment temperature initially is at room temperature. When the electronic device is turned on and the processor runs, the processor puts out heat. Once the temperature sensor detects that the local environment temperature has exceeded the set point temperature, the controller turns on the fan to maximum speed or another prescribed speed. The fan is selected so as to be able to adequately cool the local environment temperature while at full speed.

Once the fan reduces the local environment temperature to the set point temperature, the fan begins to turn off. There is a lag, however, in turning off the fan. While the fan is turning off, the processor is still running, and thus still putting out heat. Before the fan can turn all the way off, the local environment temperature rises. According to another aspect of the invention, rather than allow the fan to turn all the way off, then turn all the way on again, the controller's integrator linearizes the system response enabling the fan to be driven at less than maximum speed. Specifically, the controller is driven at a speed proportional to the heat being putting out into the local environment. Depending on the operating conditions and the room temperature, the specific fan speed required to maintain the local environment temperature at the set point temperature will vary. For example, the fan speed may decrease to three-quarter speed, then be maintained at three-quarter speed to maintain the local environment temperature at the set point temperature. As the heat put out by the processor decreases, the fan speed needed to maintain the local environment temperature also decreases. The controller responds in turn by decreasing the fan speed. As the heat put out by the processor increases, the fan speed needed to maintain the local environment temperature also increases. In a preferred embodiment the lag time for the system to respond in maintaining the local environment temperature is a few seconds or less (excluding the case where the fan motor saturates). In effect, the controller reduces the lag time of a thermistor from the order of 100 seconds in a conventional open loop control circuit to the order of approximately 1 seconds for this closed loop control circuit.

According to another aspect of the invention, the fan controller includes a bridge circuit coupled to an integrator circuit. The integrator is coupled in series to a buffer, which in turn is coupled to the fan's motor. The bridge circuit includes the thermistor and a reference resistor bridged to a pair of resistors which define the set point temperature of the controller. The pair of resistors are selected to define a set point temperature at which the fan turns on. Specifically, when the thermistor detects a temperature which equals the set point temperature the bridge circuit is in balance. A balanced bridge circuit does not drive the integrator circuit. Further, when the thermistor detects a temperature which is less than the set point temperature the bridge circuit drives the integrator circuit into an off state. However, when the thermistor detects a temperature which is greater than the set point temperature the bridge circuit has a positive value which drives the integrator circuit into a positive or active state. The integrator circuit in response turns on the fan to a prescribed speed (e.g., full speed or another speed).

In a servo control circuit lag time occurs as a pole. A conventional thermistor with appropriate thermal mass (e.g., microprocessor) has a lag time of approximately 100 seconds. According to another aspect of the invention, the integrator circuit compensates for such pole reducing the effective lag time of the controller to approximately 1 second or less during steady state operation with the fan motor unsaturated.

According to one advantage of the invention, a fast response to sensed temperature is achieved to control fan speed to maintain local environment temperature at a prescribed set point temperature. These and other aspects and advantages of the invention will be better understood by reference to the following detailed description taken in conjunction with the accompanying drawings.

DESCRIPTION OF SPECIFIC EMBODIMENTS

Overview

Figure 1:
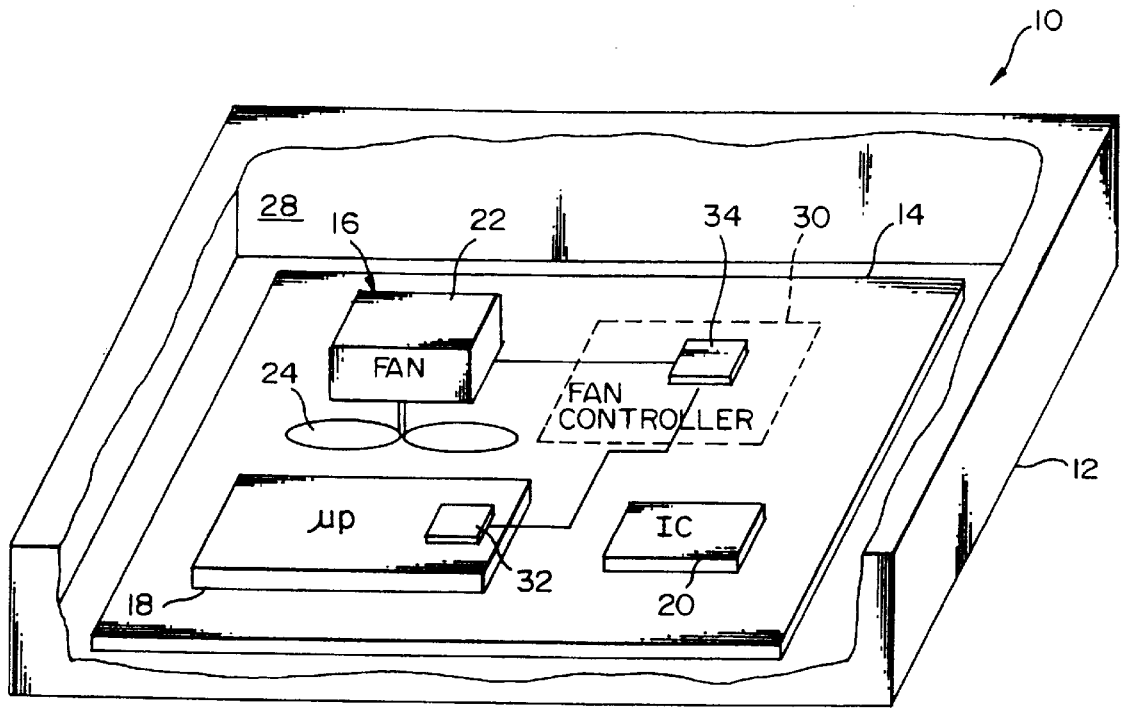
FIG. 1 is a diagram of a computer having internal components and a fan controller according to an embodiment of this invention.

FIG. 1 shows a computer 10 having a computer case 12, a circuit board 14 and a fan 16. The circuit board 14 includes a processor 18 and one or more other integrated circuits (ICs) 20. Also included is a fan controller 30 for controlling the fan 16. The fan 16 includes a motor 22 and a fan blade 24. The controller includes a temperature sensor 32 and other circuitry 34. During operation the integrated circuits and other components consume power. Some of such power is dissipated in the form of heat. The dissipated heat causes the temperature of the IC's to increase and causes the local environment temperature within the computer case 12 to increase. The processor 18, ICs 20 and other components typically have specified operating temperature ranges. If the temperature goes outside of such specified range, the components may not behave in the manner intended. In particular the response characteristic of a circuit may vary undesirably outside the operating temperature range. As a result, cooling techniques typically are used to maintain the components and the local environment 28 within the computer case below the maximum temperature of a given operating temperature range. FIG. 1 shows a fan 16 which serves to cool the processor 18, ICs 20 and the local environment 28 of the computer case 12.

When the computer 10 is run, the components heat up increasing the temperature within the computer case 12. A temperature sensor 32 detects the temperature in the vicinity of the sensor 32. In an exemplary embodiment the temperature sensor is located in contact with, adjacent to or near the processor 18 (or a heat sink for the processor 18). Typically, when the detected temperature exceeds a reference temperature, the fan 16 turns on at full speed. In a conventional system, the fan stays on at full speed until the temperature falls below a prescribed value (e.g., at the reference temperature or another temperature less than the reference temperature). The fan then turns off. Thus, the fan is either on or off in a conventional system.

The fan controller 30 of this invention operates in both a saturated region and a linear region. When the temperature sensor 32 detects a temperature above the reference temperature the controller turns on the fan 16 at full speed. Due to a temperature response lag, the actual temperature in the local environment may significantly exceed the reference temperature. Thus, the controller 34 operates in the saturated region running the fan 16 at full speed. Eventually, the fan 16 brings the temperature down. As the temperature decreases below the reference temperature, the controller eventually comes out of saturation into the linear region of operation. While the detected temperature is above the reference temperature, the controller remains saturated. The fan is biasing the temperature of the environment 28 downward toward room the reference temperature, while the circuits 18, 20 are putting out heat biasing the temperature of the environment 28 upward. In some instances the circuits 18, 20 put out so much heat that the controller 30 remains in saturation and the fan 16 runs at full speed. In other instances the circuits 18, 20 put out enough heat to keep the temperature in the environment at the reference temperature, but not enough to cause operation of the controller to occur in the saturated region. This is the linear region of operation where the controller 30 varies the fan speed so as to maintain the temperature at a steady state temperature equal to the reference temperature. As the amount of heat put out by the circuits 18, 20 change, the amount of fan speed required to maintain such steady state temperature changes. In still other instances, the circuits 18, 20 stop putting out enough heat to raise the local environment temperature above the reference temperature. In such instances the fan drives the local environment temperature to the reference temperature, then the fan speed goes to zero. Heat dissipation by simple convection may then be enough to maintain the local temperature below the reference temperature (until the circuits 18, 20 start putting out enough heat for the fan to be required again).

Controller Schematic

Figure 2:
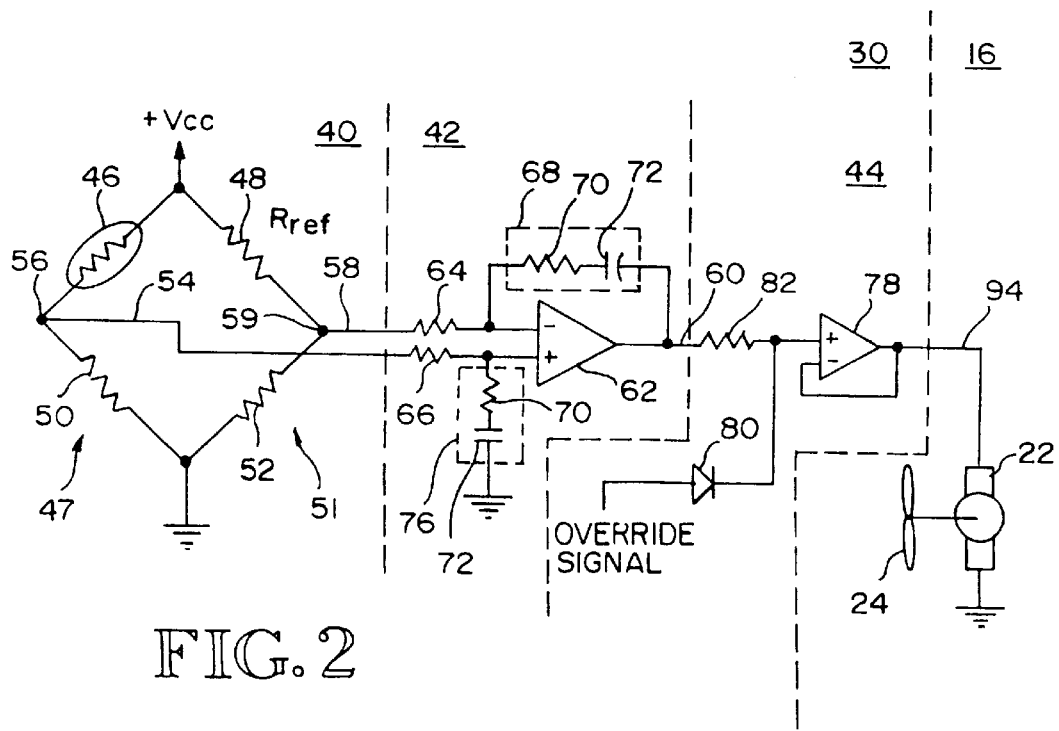
FIG. 2 is a schematic diagram of a fan controller and fan according to an embodiment of this invention.

FIG. 2 is an electrical schematic of a fan controller 30 according to an embodiment of this invention. The controller 30 includes a bridge circuit 40, an integrator circuit 42 and a buffer circuit 44. The bridge circuit 40 includes the temperature sensor 32. In one embodiment the temperature sensor is a thermistor 46. The thermistor 46 varies its resistance as a function of temperature. The response of the thermistor 46 however exhibits a lag time. In a conventional open loop temperature control circuit using a thermistor, the response lag is approximately 100 seconds. The integrator circuit 42, as described later, compensates for such lag to substantially improve the response characteristic of the controller 30. The bridge circuit 40 also includes a reference resistor 48 and bias resistors 50, 52. The thermistor 46 and resistor 50 define a first bridge 47 between a supply voltage plane and a ground plane. A first bridge signal 54 is output at a node 56 between the thermistor 46 and resistor 50. The reference resistor 48 and bias resistor 52 define a second bridge 51 which also occur between the supply voltage plane and the ground plane. A second bridge signal 58 is output at a node 59 between the reference resistor 48 and resistor 52.

The resistance of the reference resistor 48 is prescribed based upon a desired reference temperature value for the controller 30. When the thermistor 46 detects a temperature equal to the reference temperature the first bridge signal 54 and second bridge signal 59 are to be equal, (e.g., the bridge circuit 40 is balanced). In one embodiment the bias resistors 50, 52 are selected to be equal values and the reference resistor 48 is selected to be the resistance of the thermistor 46 at the reference temperature. In a preferred embodiment the bias resistors 50, 52 are selected to bias the integrator circuit into a linear region of operation for detected temperatures between the reference temperature and a linear region border temperature. The linear region border temperature in one embodiment is approximately 20° C. above the reference temperature.

When the thermistor 46 detects a temperature less than the reference temperature the first bridge signal 54 is less than the second bridge signal 59 and the controller 30 does not drive the fan 16. When the thermistor 46 detects a temperature equal to the reference temperature the first bridge signal 54 equals the second bridge signal 59 and the controller 30 does not drive the fan 16. When the thermistor 46 detects a temperature greater than the reference temperature the first bridge signal 54 is greater than the second bridge signal 59 and the controller 30 does drive the fan 16. Note that in alternative embodiments the polarities may vary such that the first bridge signal 54 is less than the second bridge signal 59 when the detected temperature exceeds the reference temperature and the controller 30 drives the fan 16. The first bridge signal 54 and the second bridge signal 59 define respective outputs of the bridge circuit 40. Such outputs also are referred to as a differential output which drives the integrator circuit to an active state while the detected temperature exceeds the reference temperature, and which leads the integrator circuit to stabilize at an inactive state while the detected temperature does not exceed the reference temperature.

The integrator circuit 42 receives the first bridge signal 54 and the second bridge signal 59 and produces in response an integrator output signal 60. The integrator circuit 42 includes an amplifier 62 configured to perform an integration of the difference between the first bridge signal 54 and the second bridge signal 59. The first bridge signal 54 is coupled to the noninverting input of the amplifier 62 via a series resistor 66. The second bridge signal 59 is coupled to the inverting input of the amplifier 62 via a series resistor 64. The integrator circuit 42 also includes a compensation network 68 in a feedback path of the amplifier 62 between amplifier 62 output and the amplifier 62 input receiving the second bridge signal (e.g., the inverting input). In one embodiment the compensation network 68 is an RC network including a resistor 70 and a capacitor 72. A matching network 76 is wired between the ground plane and the other input of the amplifier (e.g., the noninverting input). The compensation network 68 serves to cancel out a pole in the controller response corresponding to the lag time of the thermistor 46.

In one embodiment the amplifier output signal 60 is fed to a unity gain amplifier 78 which serves to sink current while driving the fan motor 22. The buffer 78 outputs a control signal to the fan motor 22. In an exemplary embodiment the fan motor operates over a voltage range of 3–5 volts. Below 3 volts, the fan speed falls to zero. Above 3 volts the fan speed increases to a maximum speed at 5 volts. The fan motor is then in saturation at 5 volts.

In the embodiment illustrated an override feature is included which enables the fan 16 to be turned on at full speed by an alternative control signal. The input to buffer 78 also is wired to an override signal via a diode 80. A resistor 82 occurs in parallel with the diode along the path of the integrator output signal 60. While the logic state of the override signal is low, the integrator output signal 60 defines the state of the buffer 78. When the logic state of the override signal is high, the buffer 78 is forced into saturation so as to turn the fan 16 on at full speed (e.g., maximum voltage less one diode voltage drop). The override signal is used to test the fan or as an alternative control signal. The logic state of the override signal can be controlled for example by software.

Figure 3:
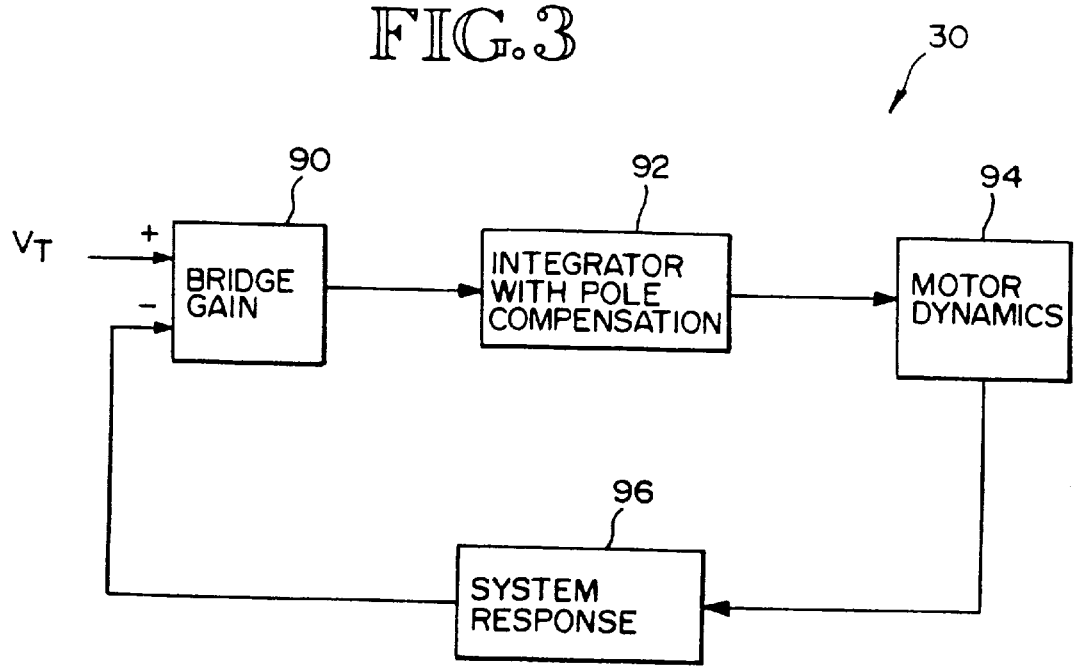
FIG. 3 is a control diagram of a fan controller according to an embodiment of this invention.
Figure 4:
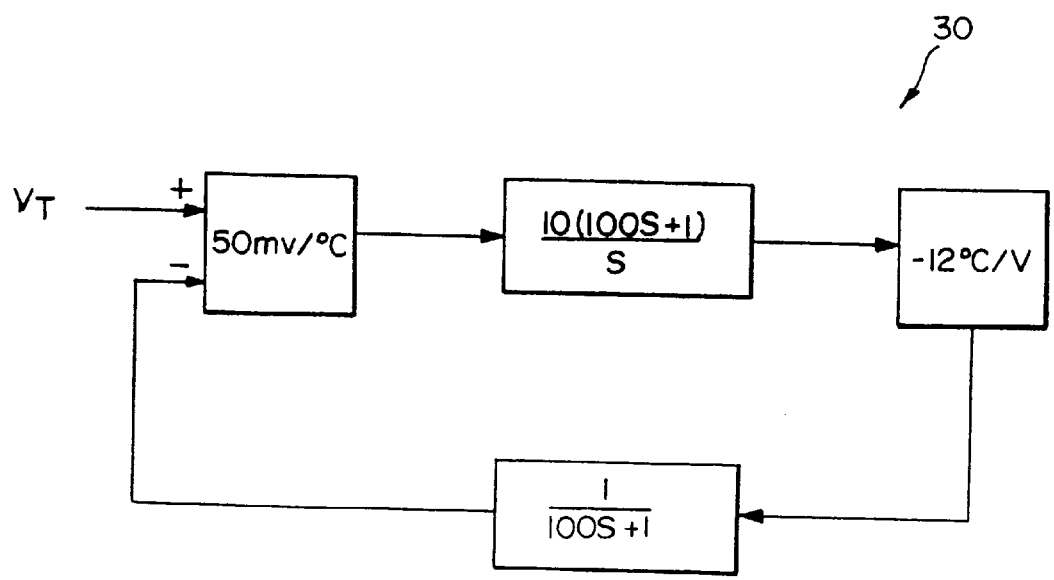
FIG. 4 is a control diagram for an exemplary embodiment of the fan controller of FIG. 2.

FIG. 3 shows a control diagram of the controller 30. The bridge circuit 40 is depicted by a bridge gain function 90. The integrator circuit 42 is depicted by an integration function with pole compensation. The fan motor 22 is depicted by a motor dynamics function 94. The system response is depicted by a system response function 96. Consider an exemplary control embodiment as shown in FIG. 4. The bridge gain function 90 is selected to be 50 mV per degree Centigrade. The integration function is depicted by the transform $10(100s+1)/s$. The value $10/s$ corresponds to the integration function. The value $100s+1$ corresponds to the compensation function. The motor is selected to have dynamics which reduce the local environment temperature by 12° C. per volt. For a given thermistor the system response is found to be $1/(100s+1)$. This corresponds to the lag time of the thermistor. Thus, the thermistor 46 introduces a pole into the control function of controller 30. The compensation function $100s+1$ previously described is selected to cancel out such pole. Specifically $10(100s+1)/s$ times $1/(100s+1)$ equals $10/s$. This is a linear control function and corresponds to the controller operation within the linear region of controller 30.

Exemplary Embodiment

In an exemplary embodiment the thermistor 46 is Semitech part number 103AT-2 manufactured by Ishizuka Electronics Corporation of Taipai, Taiwan. Such thermistor exhibits a resistance of 2.5 kΩ at 55° C. Using 55° C. as the reference temperature, the reference resistor 48 is selected to be 2.5 kΩ. The amplifier 62 selected is part number LMC6482 from National Semiconductor of Santa Clara, Calif. To operate the amplifier 62 in the linear region the bias resistors 50, 52 are selected to be 10 kΩ and the bias resistors 64, 66 are selected to 1 MΩ. The compensation network 68 is selected to have resistor 70 equal 10 MΩ and capacitor 72 be 10 microfarads. The matching network 76 includes a resistor and capacitor of the same values. Resistors 64, 66 and 82 are selected to be 1 MΩ. A control diagram for embodiment is shown in FIG. 4. The components and actual values may change for other exemplary embodiments.

Following is a description of the operation of the controller 30. Initially the thermistor 46 detects an local environment temperature equal to room temperature (e.g., 25° C). When the computer 10 turns on the circuits 18, 20 begin consuming power and giving off heat. The temperature detected by the thermistor 46 begins to increase. While the detected temperature is less than the reference temperature, 55° C., the first bridge signal 54 is less than the second bridge signal 59. As a result the integrator 62 does not generate an active output. When the detected temperature exceeds the reference temperature, 55° C., the first bridge signal 54 exceeds the second bridge signal 59. The integrator output signal 60 now goes active. Due to the response lag of the thermistor it is expected that the thermistor will continue to detect increases in local environment temperature for a short while. As a result, the output signal 60 will drive the buffer 78 into saturation causing the control signal 94 to be at maximum voltage (e.g., 5 volts). The control signal 94 thus drives the fan 16 at full speed. The fan 16 in turn cools the local environment 28 causing the detected temperature to decrease. Eventually, the fan 16 lowers the temperature enough for the output signal 60 to take the buffer 78 out of saturation. The controller 30 is now operating in the linear region. For any changes in detected temperature the rate of change of the integrator response (e.g., the output signal 60 and control signal 94) varies proportionally to the changes in detected temperature. The fan motor receiving the control signal now varies the rate of change of the fan speed proportionally to the changes in detected temperature. While operating in this linear region, the compensation network 68 cancels out the pole in the control loop corresponding to the lag time of the thermistor 46. As a result, the response time of the controller is substantially faster than that of conventional controllers. For the embodiment of FIG. 4 the response time while in the linear region is approximately ⅙ seconds. While operating in the linear region the fan speed is varied to maintain the local environment temperature at or biased toward the reference temperature. The actual temperature will change over the short term depending on the heat dissipated by the circuits 18, 20. The controller 30 however will bias the temperature toward the reference temperature and seek to maintain the local environment temperature at a temperature no greater than the reference temperature. The rate of change of the control signal voltage magnitude decreases as the detected temperature approaches the reference temperature. Once the detected temperature goes below the reference temperature, the fan speed decreases. While the detected temperature exceeds the reference temperature, the rate of change of the control signal magnitude varies proportionally with increases and decreases in detected temperature. Correspondingly the fan speed varies so as to bias the detected temperature toward a steady state temperature condition.

In summary, the rates of change of the output signal 60 and control signal 94 vary proportionally with changes in detected temperature while the buffer 78 is unsaturated and the output signal 60 is active. Also, the fan motor speed varies proportionally with the control signal 94 while the output signal 60 is active and the buffer 78 is not saturated. The fan motor 22 is not driven while the output signal 60 is inactive.

Meritorious and Advantageous Effects

According to one advantage of the invention, a fast response to sensed temperature is achieved to control fan speed to maintain local environment temperature at a prescribed set point temperature.

Although a preferred embodiment of the invention has been illustrated and described, various alternatives, modifications and equivalents may be used. Therefore, the foregoing description should not be taken as limiting the scope of the inventions which are defined by the appended claims.

What is claimed is:

1. An electronic device, comprising:

a case having a local environment temperature within the case a reference temperature and a steady state local environment temperature condition when the local environment temperature equals the reference temperature;

a fan having a speed and a rate of change of fan speed;

a temperature sensor for detecting the local environment temperature inside the case, the temperature sensor exhibiting a lag time for indicating actual local environment temperature; and control circuitry connected to the temperature sensor and the fan, the control circuitry implementing closed loop control over the fan to vary the speed of the fan in a manner which cancels out the lag time of the temperature sensor during the steady state local environment temperature condition of the electronic device, wherein during the steady state local environment temperature condition of the electronic device the rate of change of the speed of the fan varies in proportion to variation in detected local environment temperature.

2. The electronic device of claim 1, wherein the lag time of the temperature sensor creates a system response pole within the control circuitry and wherein the control circuitry comprises a bridge circuit and an integrator circuit, the bridge circuit including the temperature sensor, the bridge circuit generating a first signal and a second signal, the first signal varying with changes in the resistance of the temperature sensor, the second signal equal to the first signal when the temperature sensor detects a temperature equal to the reference temperature, and wherein the integrator circuit is responsive to the first signal and the second signal to generate an output signal which is driven active while the detected temperature exceeds the reference temperature and which is driven into an off state while the detected temperature does not exceed the reference temperature, the integrator circuit including a compensation network which cancels out the system response pole during the steady state local environment temperature condition of the electronic device.

3. The electronic device of claim 1, in which the control circuitry comprises a RC network which cancels out the lag time of the temperature sensor during the steady state local environment temperature operation.

4. An electronic device, comprising:
a case having a local environment temperature within the case,
a reference temperature, and a steady state local environment temperature condition when the local environment temperature equals the reference temperature;
a fan having a speed and a rate of change of fan speed;
a temperature sensor for detecting the local environment temperature inside the case, the temperature sensor exhibiting a lag time for indicating actual local environment temperature, the lag time of the temperature sensor creates a system response pole within the control circuitry; and
control circuitry connected to the temperature sensor and the fan, the control circuitry implementing closed loop control over the fan to vary the speed of the fan in a manner which cancels out the lag time of the temperature sensor during the steady state local environment temperature condition of the electronic device, wherein during the steady state local environment temperature condition of the electronic device the rate of change of the speed of the fan varies in proportion to variation in detected local environment temperature, wherein the control circuitry comprises a bridge circuit and an integrator circuit, the bridge circuit including the temperature sensor, the bridge circuit generating a first signal and a second signal, the first signal varying with changes in the resistance of the temperature sensor, the second signal equal to the first signal when the temperature sensor detects a temperature equal to the reference temperature, and wherein the integrator circuit is responsive to the first signal and the second signal to generate an output signal which is driven active while the detected temperature exceeds the reference temperature and which the output signal is driven into an off state while the detected temperature does not exceed the reference temperature, the integrator circuit including a compensation network which cancels out the system response pole during the steady state local environment temperature condition of the electronic device; and
wherein the compensation network is a RC network occurring along the feedback path of the integrator circuit, the feedback path routing the output signal via the compensation network to an input of the integrator circuit which receives the second signal.

5. A method for controlling a fan having a speed and a rate of change of fan speed to cool a local environment within an electronic device case, the method comprising the steps of:
detecting the local environmental temperature with a temperature sensor, the temperature sensor exhibiting a lag time; and
varying the speed of the fan in a manner which cancels out the lag time of the temperature sensor during a steady state local environment temperature condition, wherein during the steady state local environment temperature condition the rate of change of the speed of the fan varies in proportion to variation in the detected local environment temperature.

6. The method of claim 5, further comprising the steps of:
generating a control signal, the control signal having a rate of change, to turn on a cooling fan motor having a first speed and a rate of change of fan speed to the first speed when the detected temperature exceeds a reference temperature;
cooling the internal environment with the cooling fan to reduce the temperature detected by the temperature sensor;
reducing the control signal when the detected temperature goes below the reference temperature, wherein fan speed decreases below the first speed as the control signal is reduced; and
varying the rate of change of the control signal proportionally with increases and decreases in the detected temperature while the detected temperature exceeds the reference temperature and correspondingly varying the rate of change of the speed of the fan so as to bias the detected temperature toward a steady state local environment temperature condition where the detected temperature equals the reference temperature.

7. The method of claim 6, further comprising the steps of:
generating a first signal and a second signal with a bridge circuit including the temperature sensor, in which the temperature sensor has a resistance which varies as a function of temperature, and in which the second signal is constant, and in which the first signal equals the second signal when the temperature sensor detects a temperature equal to a reference temperature;
varying the first signal with changes in the resistance of the temperature sensor; and
integrating a difference between the first signal and second signal to derive an output signal, wherein the output signal drives a buffer which generates the control signal.

8. The method of claim 7, in which the step of integrating further includes the step of canceling a system response pole corresponding to the exhibited lag time of the temperature sensor.

9. The method of claim 8, in which the step of generating the control signal further comprises the step of causing the buffer to go into saturation, and in which the step of cooling further comprises causing the buffer to come out of saturation, and in which the step of reducing the control signal occurs after the buffer comes out of saturation.

10. The method of claim 9, in which the step of varying the rate of change of the control signal occurs while the buffer is out of saturation.

11. The method of claim 9, in which the steady state temperature condition is maintained while the buffer is out of saturation during the step of varying the rate of change of the control signal.

12. The method of claim 9, in which during the step of varying the rate of change of the control signal the buffer moves into saturation.

13. The method of claim 5, in which the step of varying the speed of the fan comprises the step of varying the speed of the fan with a control circuit including a RC network, the RC network canceling out the lag time of the temperature sensor during the steady state local environment temperature operation.

14. A method for controlling fan speed in proportion to heat generated within an electronic device case internal environment, comprising the steps of:
generating a first signal which varies as a function of temperature detected at a temperature sensor, wherein the temperature sensor exhibits a response lag before indicating actual detected temperature equal to local environment temperature around the temperature sensor, the temperature sensor being within the electronic device case;
generating a reference signal corresponding to a reference temperature;
integrating a difference between the first signal and the reference signal to derive an output signal having a rate of change, the output signal driven active while the first signal exceeds the reference signal;

during the step of integrating, canceling a control loop pole corresponding to the response lag of the temperature sensor;

buffering the output signal at a buffer to derive a control signal having a rate of change which drives a motor of a cooling fan having a first speed and a rate of change of fan speed within the electronic device case;

cooling the electronic device case internal environment with the cooling fan at the first speed to reduce the temperature detected by the temperature sensor;

reducing the output signal and control signal as the detected temperature approaches the reference temperature, wherein fan speed decreases below the first speed as the control signal is reduced; and varying the rate of change of the output signal and the rate of change of the control signal proportionally with increases and decreases in detected temperature while the detected temperature exceeds the reference temperature, and correspondingly varying the rate of change of the speed of the fan so as to bias the detected temperature toward a steady state temperature condition in the electronic device internal environment where the detected temperature equals the reference temperature.

15. The method of claim 14, further comprising the step of driving the buffer with the output signal into saturation, and wherein during the step of cooling the buffer comes out of saturation, and wherein the step of reducing the control signal occurs after the buffer comes out of saturation.

16. The method of claim 15, in which the step of varying the rate of change of control signal occurs while the buffer is out of saturation.

17. The method of claim 15, in which the steady state temperature is maintained while the buffer is out of saturation during the step of varying rate of change of the control signal.

18. The method of claim 14, further comprising the step of:

during the steady state temperature condition in the electronic device internal environment, canceling out the response lag of the temperature sensor with RC network.

* * * * *